(12) United States Patent
Wang et al.

(10) Patent No.: US 11,563,175 B2
(45) Date of Patent: Jan. 24, 2023

(54) DISPLAY PANEL AND MASK

(71) Applicant: WUHAN CHINA STAR OPTOELECTRONICS SEMICONDUCTOR DISPLAY TECHNOLOGY CO., LTD., Hubei (CN)

(72) Inventors: Shoucheng Wang, Hubei (CN); Xue Li, Hubei (CN); Mian Zeng, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 213 days.

(21) Appl. No.: 16/971,023

(22) PCT Filed: Jan. 13, 2020

(86) PCT No.: PCT/CN2020/071767
§ 371 (c)(1),
(2) Date: Aug. 19, 2020

(87) PCT Pub. No.: WO2021/036179
PCT Pub. Date: Mar. 4, 2021

(65) Prior Publication Data
US 2021/0135113 A1    May 6, 2021

(30) Foreign Application Priority Data
Aug. 29, 2019  (CN) .......................... 201910809287.5

(51) Int. Cl.
H01L 51/00    (2006.01)
H01L 27/32    (2006.01)
H01L 51/52    (2006.01)
H01L 51/56    (2006.01)

(52) U.S. Cl.
CPC ...... H01L 51/0011 (2013.01); H01L 27/3246 (2013.01); H01L 51/5234 (2013.01); H01L 51/5253 (2013.01); H01L 51/56 (2013.01); H01L 2251/558 (2013.01)

(58) Field of Classification Search
None
See application file for complete search history.

(56) References Cited

U.S. PATENT DOCUMENTS

2019/0214601 A1*   7/2019   Park .................. H01L 51/5012

FOREIGN PATENT DOCUMENTS

| CN | 107658332 A | 2/2018 |
| CN | 108559948 A | 9/2018 |
| CN | 108866476 A | 11/2018 |
| CN | 109378316 A | 2/2019 |

(Continued)

Primary Examiner — Michelle Mandala
(74) Attorney, Agent, or Firm — PV IP PC; Wei Te Chung; Ude Lu

(57) ABSTRACT

The present disclosure provides a display panel and a mask. The display panel does not dispose a common electrode layer in a transparent area and an aisle area, and by this way, after the transparent area of the display panel is cut to form a through-hole, the common electrode layer can still be protected by other film layers and not be directly exposed to air, thereby preventing intrusion of water and oxygen.

19 Claims, 7 Drawing Sheets

(56) References Cited

FOREIGN PATENT DOCUMENTS

| CN | 109616574 A | 4/2019 |
|---|---|---|
| CN | 109817678 A | 5/2019 |
| CN | 110010665 A | 7/2019 |
| CN | 110018610 A | 7/2019 |
| CN | 110021640 A | 7/2019 |
| CN | 110047878 A | 7/2019 |
| CN | 110571253 A | 12/2019 |
| JP | 2003202818 A | 7/2003 |

* cited by examiner

DISPLAY PANEL AND MASK

CROSS REFERENCE TO RELATED APPLICATIONS

The present application claims priority of the Chinese patent application No. CN201910809287.5 filed on Aug. 29, 2019 with the National Intellectual Property Administration, titled "Display panel and mask", which is incorporated by reference in the present application in its entirety.

FIELD OF INVENTION

The present disclosure relates to the field of display technologies, and more particularly, to a display panel and a mask.

BACKGROUND OF INVENTION

With development of full screen technology, a technique of disposing electronic components, such as a camera, under a display screen is a development trend. To ensure lighting effects of the electronic components (such as a camera), a display panel above the electronic components needs to be hollowed out in current technology.

In OLED display panels, some film layers of light-emitting functional layers, such as a common electrode layer, form a whole layer by evaporation, and these film layers would be directly exposed to air after being hollowed out, which causes water and oxygen to intrude a display area along the light-emitting functional layers.

Therefore, current full screen technology has a problem that water and oxygen would intrude a display area along a common electrode layer, which needs to be resolved.

Technical problem: the present disclosure provides a display panel and a mask to improve the technical problem that water and oxygen would intrude a display area along a common electrode layer in current full screen technology.

SUMMARY OF INVENTION

To solve the above problem, the present disclosure provides following technical solutions:

An embodiment of the present disclosure provides a display panel which comprises a non-display area, a display area, a transparent area, and an aisle area. Wherein, the non-display area surrounds the display area, the transparent area and the aisle area are disposed in the display area, and the aisle area connects the non-display area to the transparent area; wherein the display panel comprises a common electrode layer, and the common electrode layer is not disposed in the transparent area and the aisle area.

In the display panel provided by an embodiment of the present disclosure, wherein the non-display area comprises a first frame and a second frame intersecting with the first frame, and the transparent area is connected to the first frame and the second frame through the aisle area.

In the display panel provided by an embodiment of the present disclosure, wherein the aisle area comprises at least one first aisle area, at least one second aisle area, and at least one third aisle area spaced from each other, and the transparent area is connected to the first frame through the first aisle area, connected to the second frame through the second aisle area, and connected to a top corner of the first frame and the second frame through the third aisle area.

The display panel provided by an embodiment of the present disclosure comprises:

a substrate;
a drive circuit layer;
a light-emitting functional layer comprising a pixel definition layer, a pixel electrode layer, a light-emitting material layer, and the common electrode layer; and
an encapsulation layer;
wherein the drive circuit layer and the light-emitting functional layer are not disposed in the transparent area.

In the display panel provided by an embodiment of the present disclosure, wherein in the transparent area, the encapsulation layer is disposed on the substrate.

In the display panel provided by an embodiment of the present disclosure, wherein the encapsulation layer comprises a first inorganic layer, an organic layer, and a second inorganic layer.

In the display panel provided by an embodiment of the present disclosure, wherein in the transparent area, the first inorganic layer is deposited on the substrate, and the second inorganic layer is deposited on the first inorganic layer.

In the display panel provided by an embodiment of the present disclosure, wherein in the transparent area, the first inorganic layer is deposited on the substrate and forms a groove, the organic layer fills the groove, and the second inorganic layer is deposited on the organic layer.

The display panel provided by an embodiment of the present disclosure further comprises a filling layer in the transparent area, wherein the filling layer is disposed on the substrate, and the encapsulation layer is disposed on the filling layer.

The present disclosure also provides a mask which is used to manufacture the common electrode layer of the display panel provided by the present disclosure. Wherein, the display panel comprises a non-display area, a display area, a transparent area, and an aisle area, wherein the non-display area surrounds the display area, the transparent area and the aisle area are disposed in the display area, and the aisle area connects the non-display area to the transparent area; wherein the mask comprises:

a mask frame corresponding to the non-display area;
a hollowed area disposed in the mask frame and corresponding to the display area;
a masking member disposed in the hollowed area and the mask frame and corresponding to the transparent area; and
a connecting bridge connecting the mask frame and the masking member and corresponding to the aisle area.

In the mask provided by an embodiment of the present disclosure, wherein the mask frame comprises a first mask frame and a second mask frame intersecting with the first mask frame, and the masking member is connected to the first mask frame and the second mask frame through the connecting bridge.

In the mask provided by an embodiment of the present disclosure, wherein the connecting bridge comprises at least one first connecting bridge, at least one second connecting bridge, and at least one third connecting bridge spaced from each other, and the masking member is connected to the first mask frame through the at least one first connecting bridge, connected to the second mask frame through the at least one second connecting bridge, and connected to a top corner of the first mask frame and the second mask frame through the at least one third connecting bridge.

In the mask provided by an embodiment of the present disclosure, wherein widths of the first connecting bridge, the second connecting bridge, and the third connecting bridge range from 0.2 millimeters to 0.6 millimeters.

In the mask provided by an embodiment of the present disclosure, wherein lengths of the first connecting bridge, the second connecting bridge, and the third connecting bridge range from 3 millimeters to 6 millimeters.

In the mask provided by an embodiment of the present disclosure, wherein a distance from the masking member to the first mask frame ranges from 100 μm to 500 μm.

In the mask provided by an embodiment of the present disclosure, wherein a distance from the masking member to the second mask frame ranges from 100 μm to 500 μm.

In the mask provided by an embodiment of the present disclosure, wherein a diameter of the masking member ranges from 3 millimeters to 6 millimeters.

In the mask provided by an embodiment of the present disclosure, wherein a material of the mask is stainless steel or an alloy of indium alloys.

In the mask provided by an embodiment of the present disclosure, wherein a thickness of the mask ranges from 0.01 millimeters to 0.3 millimeters.

In the mask provided by an embodiment of the present disclosure, wherein a thickness of the masking member is greater than a thickness of the mask frame.

Beneficial effect: the present disclosure provides a display panel and a mask. The display panel comprises a non-display area, a display area, a transparent area, and an aisle area. Wherein, the non-display area surrounds the display area, the transparent area and the aisle area are disposed in the display area, and the aisle area connects the non-display area to the transparent area; wherein the display panel comprises a common electrode layer, and the common electrode layer is not disposed in the transparent area and the aisle area. Because the common electrode layer is not disposed in the transparent area and the aisle area, the common electrode layer can still be protected by other film layers and not be directly exposed after the transparent area of the display panel is cut to form a through-hole, thereby preventing water and oxygen from intruding the display area through the through-hole and along the common electrode layer, which relieves the technical problem that water and oxygen would intrude the display area along the common electrode layer in current full screen technology.

DETAILED DESCRIPTION OF PREFERRED EMBODIMENTS

The present disclosure provides a display panel and a mask. In order to make the purpose, technical solutions, and effects of this disclosure clearer and more definite, the following further describes this disclosure in detail with reference to the drawings and embodiments. It should be understood that the specific embodiments described herein are only used to explain the disclosure, and are not used to limit the disclosure.

An embodiment of the present disclosure can improve the technical problem which a cutting-edge section produced by hollowing out a common electrode layer easily causes water vapor intrusion in current full screen technology.

Figure 1:
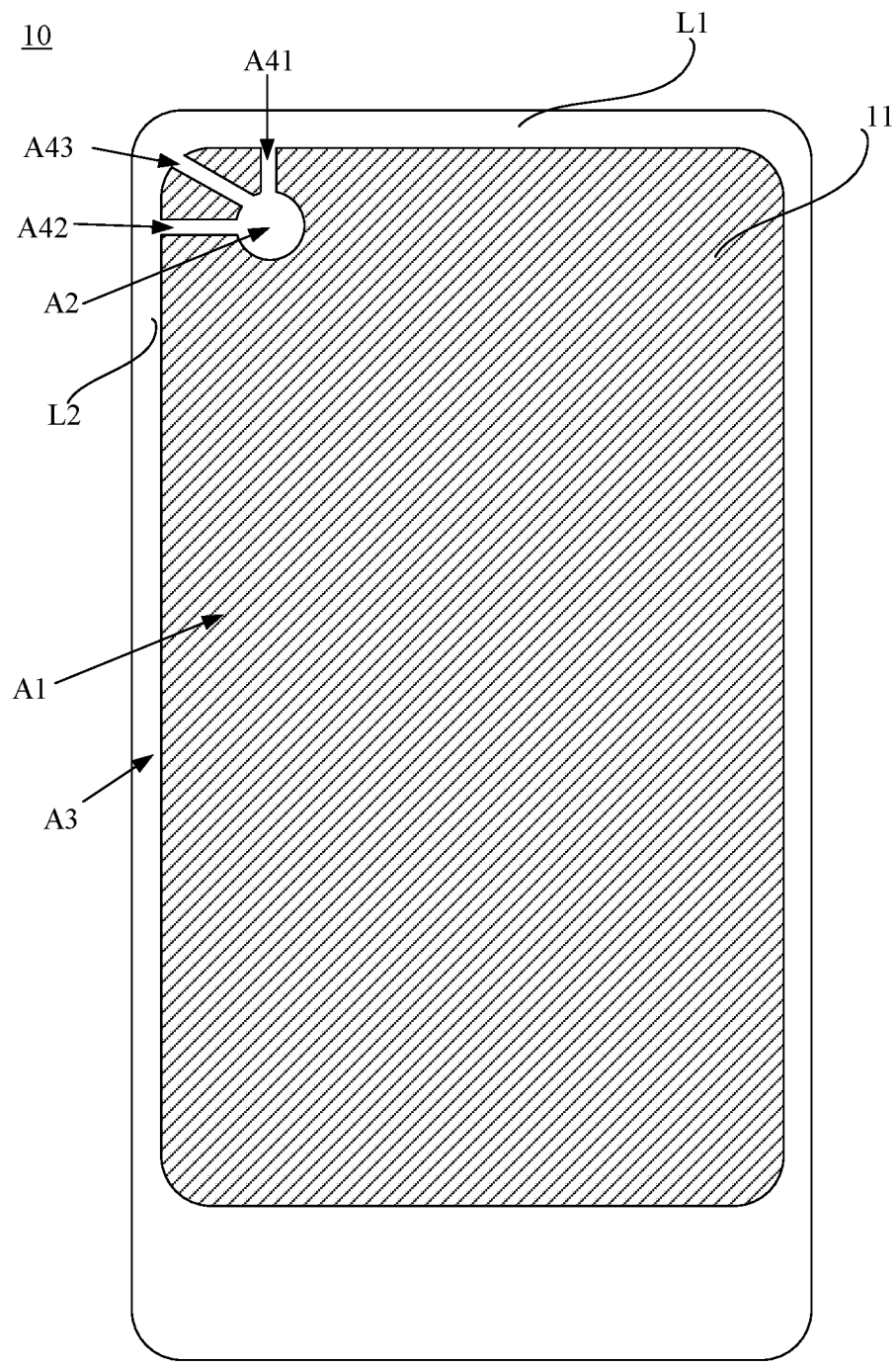
FIG. 1 is a top view of a common electrode layer of a display panel according to an embodiment of the present disclosure.
Figure 2:
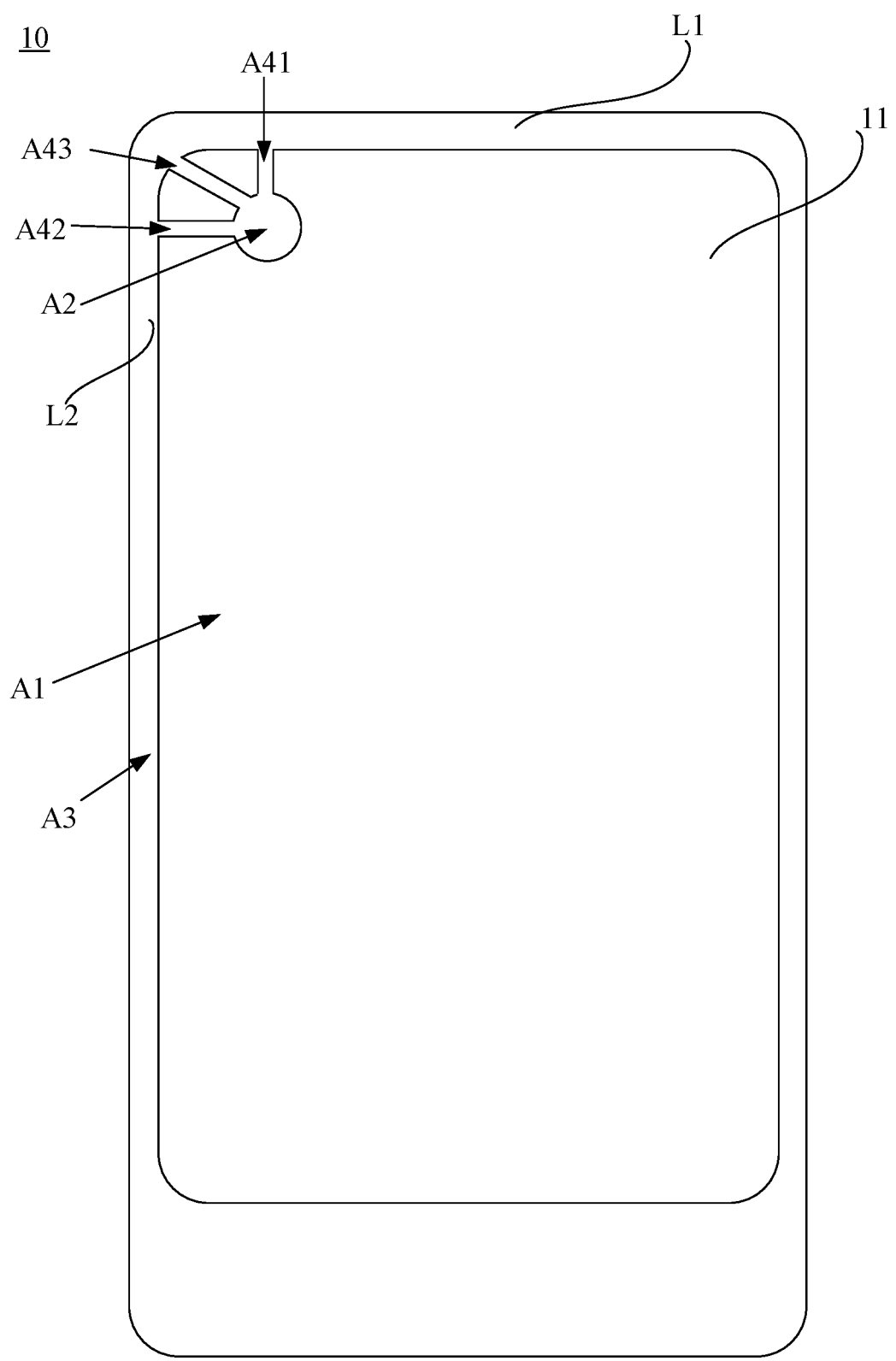
FIG. 2 is a top view of a display panel according to an embodiment of the present disclosure.

In an embodiment of the present disclosure, as shown in FIG. 1, the embodiment of the present disclosure provides a display panel 10 which comprises a non-display area A3, a display area A1, a transparent area A2 (that is a hollowed area), and an aisle area A4 (that is including A41, A42, and A43 in FIG. 1). Wherein, the non-display area A3 surrounds the display area A1, the transparent area A2 and the aisle area A4 are disposed in the display area A1, and the aisle area A4 connects the non-display area A3 to the transparent area A2. Wherein, the display panel 10 comprises a common electrode layer 11, and the common electrode layer 11 is not disposed in the transparent area A2 and the aisle area A4.

In an embodiment of the present disclosure, the transparent area A2 corresponds to the hollowed area, that is an electronic component disposing area.

In an embodiment of the present disclosure, as shown in FIG. 1, the non-display area A3 comprises a first frame L1 and a second frame L2 intersecting with the first frame L1, and the transparent area A2 is connected to the first frame L1 and the second frame L2 through the aisle area A4.

In an embodiment of the present disclosure, as shown in FIG. 1, the aisle area A4 comprises at least one first aisle area A41, at least one second aisle area A42, and at least one third aisle area A43 spaced from each other, and the transparent area A2 is connected to the first frame L1 through the first aisle area A41, connected to the second frame L2 through the second aisle area A42, and connected to a top corner of the first frame L1 and the second frame L2 through the third aisle area A43.

The embodiment of the present disclosure provides a display panel. The display panel comprises a non-display area, a display area, a transparent area, and an aisle area. Wherein, the non-display area surrounds the display area, the transparent area and the aisle area are disposed in the display area, and the aisle area connects the non-display area to the transparent area; wherein the display panel comprises a common electrode layer, and the common electrode layer is not disposed in the transparent area and the aisle area. Because the common electrode layer is not disposed in the transparent area and the aisle area, the common electrode layer can still be protected by other film layers and not be directly exposed after the transparent area of the display panel is cut to form a through-hole, thereby preventing water and oxygen from intruding the display area through the through-hole and along the common electrode layer, which relieves the technical problem that water and oxygen would intrude the display area along the common electrode layer in current full screen technology.

To further improve waterproof performance and oxygen-proof performance, a drive circuit layer and the light-emitting functional layer are not disposed in the transparent area A2.

That is, in an embodiment, the display panel 10 comprises:
a substrate;
a drive circuit layer;

a light-emitting functional layer comprising a pixel definition layer, a pixel electrode layer, a light-emitting material layer, and the common electrode layer; and an encapsulation layer;

wherein the drive circuit layer and the light-emitting functional layer are not disposed in the transparent area.

In an embodiment of the present disclosure, wherein in the transparent area, the encapsulation layer is disposed on the substrate.

This embodiment will be described with reference to specific drawings.

FIG. 2 to FIG. 5 show the display panel 10, wherein the transparent area A2 has not been hollowed out to form a through-hole.

In an embodiment of the present disclosure, as shown in FIG. 2 to FIG. 5, the display panel 10 provided by the embodiment of the present disclosure comprises a display area A1, a transparent area A2 corresponding to a disposed position of electronic components, a non-display area A3, and an aisle area A4. The display panel 10 comprises:

a substrate M1;

a drive circuit layer M2 disposed on the substrate M1, wherein the drive circuit layer M2 comprises all film layers forming a TFT circuit;

a planarization layer M3 disposed on the drive circuit layer M2;

a light-emitting functional layer 12 disposed on the planarization layer M3, wherein the light-emitting functional layer 12 comprises a pixel definition layer M4, a pixel electrode layer M5, a light-emitting material layer M6, and a common electrode layer 11; and an encapsulation layer 13 which includes a first inorganic layer M7, an organic layer M8, and a second inorganic layer M9.

Wherein, the drive circuit layer and the light-emitting functional layer are not disposed in the transparent area A2.

In the embodiment of the present disclosure, an electronic component may be an electronic component or a collection of various electronic components, such as a camera, a light sensor, and a fingerprint recognition device based on infrared radiation.

The embodiment provides a display panel. The display panel comprises a display area and an electronic component disposing area. Wherein, a drive circuit and the light-emitting functional layer are not disposed in the electronic component disposing area. By this way, after the electronic component disposing area is cut to form a through-hole, the light-emitting functional layer can still be protected by other film layers and not be directly exposed to air, thereby preventing intrusion of water and oxygen.

In an embodiment, the substrate comprises a flexible substrate, a buffer barrier layer, and an inorganic buffer layer. The drive circuit layer comprises low temperature polysilicon, a first gate insulating layer, a first gate electrode, a second gate insulating layer, a second gate electrode, an insulating layer, and source/drain electrodes. The pixel definition layer is used to define a light-emitting area. The pixel definition layer forms grooves in the light-emitting area, and forms protrusions in a non-light-emitting area.

Figure 3:
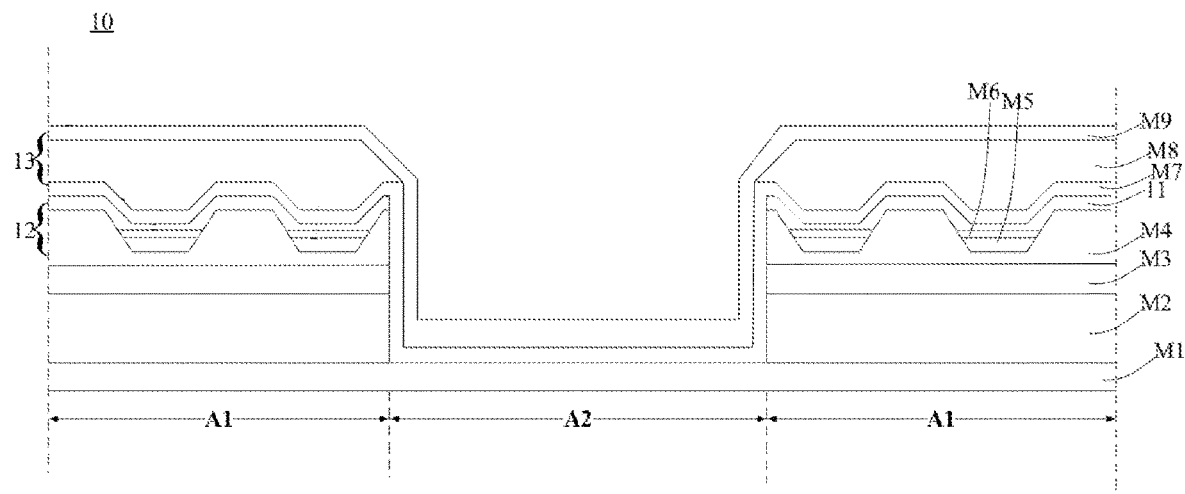
FIG. 3 is a first schematic cross-sectional diagram of a display panel according to an embodiment of the present disclosure.
Figure 4:
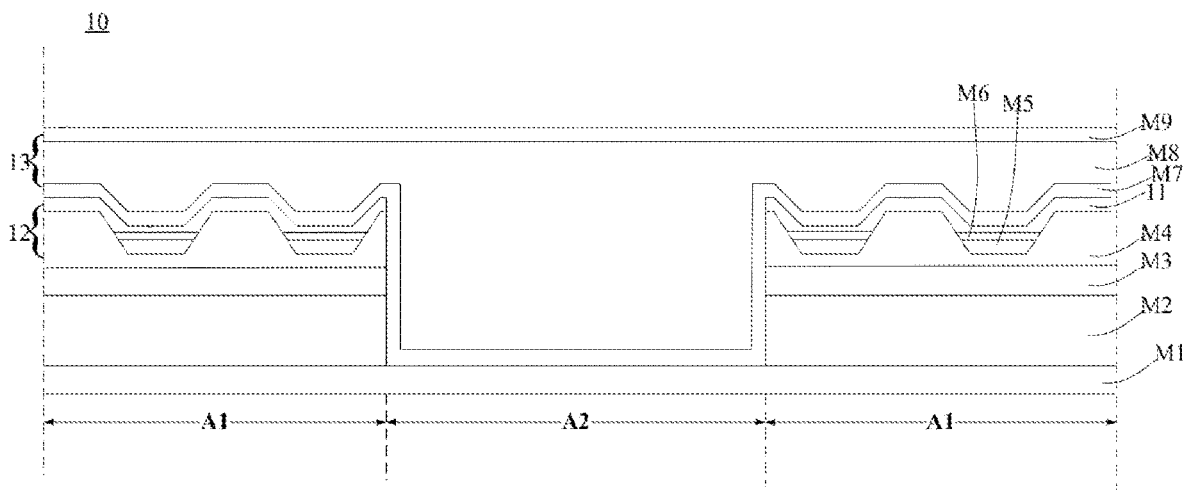
FIG. 4 is a second schematic cross-sectional diagram of a display panel according to an embodiment of the present disclosure.

In an embodiment of the present disclosure, as shown in FIG. 3 or FIG. 4, wherein in the transparent area A2, the encapsulation layer 13 is disposed on the substrate M1.

In an embodiment of the present disclosure, as shown in FIG. 3, wherein in the transparent area A2, the first inorganic layer M7 is deposited on the substrate M1, and the second inorganic layer M9 is deposited on the first inorganic layer M7.

In an embodiment of the present disclosure, as shown in FIG. 4, wherein in the transparent area A2, the first inorganic layer M7 is deposited on the substrate M1 and forms a groove, the organic layer M8 fills the groove, and the second inorganic layer M9 is deposited on the organic layer M8.

Figure 5:
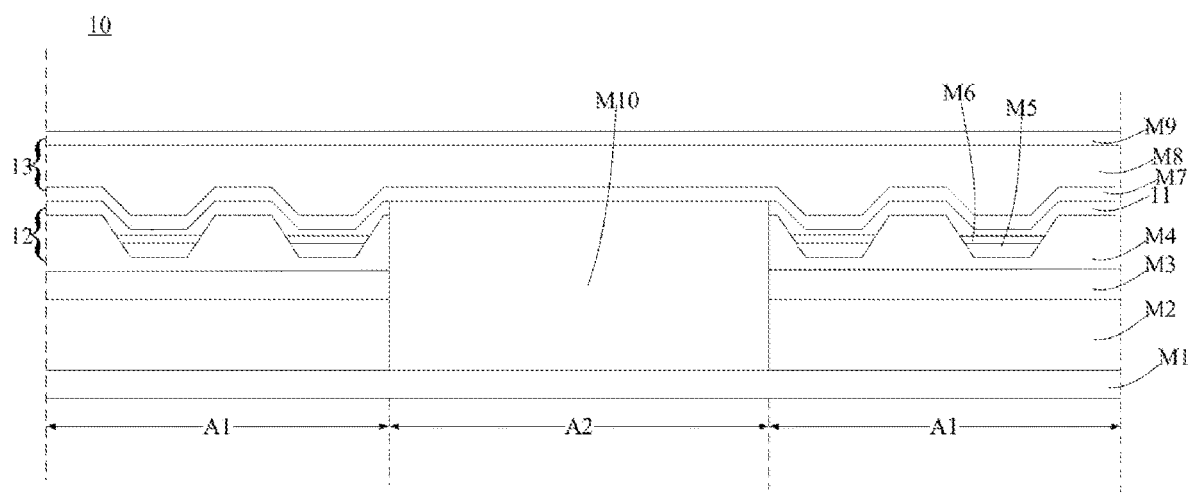
FIG. 5 is a third schematic cross-sectional diagram of a display panel according to an embodiment of the present disclosure.

In an embodiment of the present disclosure, as shown in FIG. 5, the display panel further comprises a filling layer M10 in the transparent area A2, wherein the filling layer M10 is disposed on the substrate M1, and the encapsulation layer 13 is disposed on the filling layer M10. In an embodiment of the present disclosure, a material of the filling layer M10 and a material of the organic layer M8 are same, and have a good light transmittance.

To manufacture the common electrode layer of the display panel, an embodiment of the present disclosure provides a corresponding mask. The mask is used to manufacture the common electrode layer in the light-emitting functional layer, such as a transparent cathode layer, by thermal evaporation.

Figure 6:
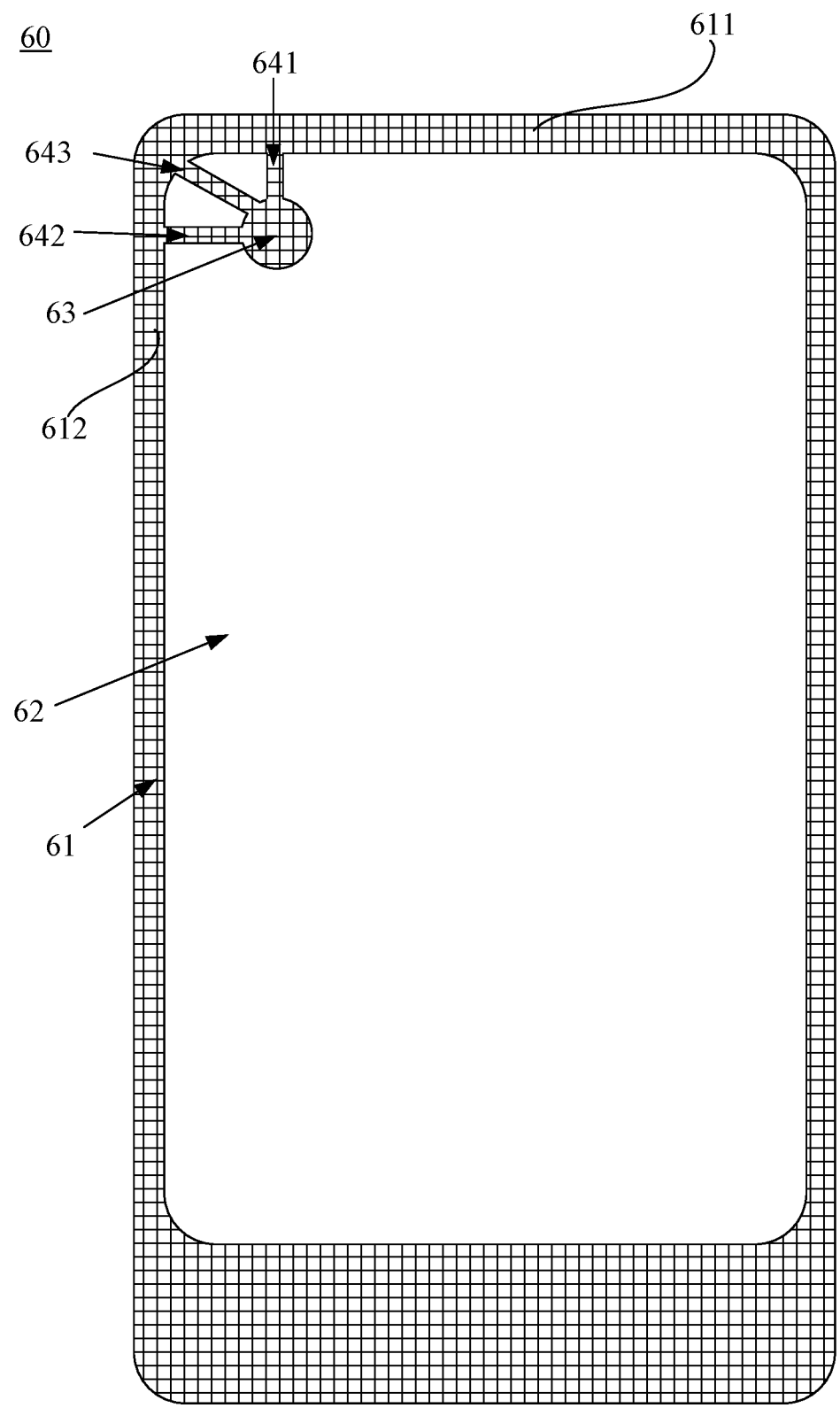
FIG. 6 is a first top view of a mask according to an embodiment of the present disclosure.
Figure 7:
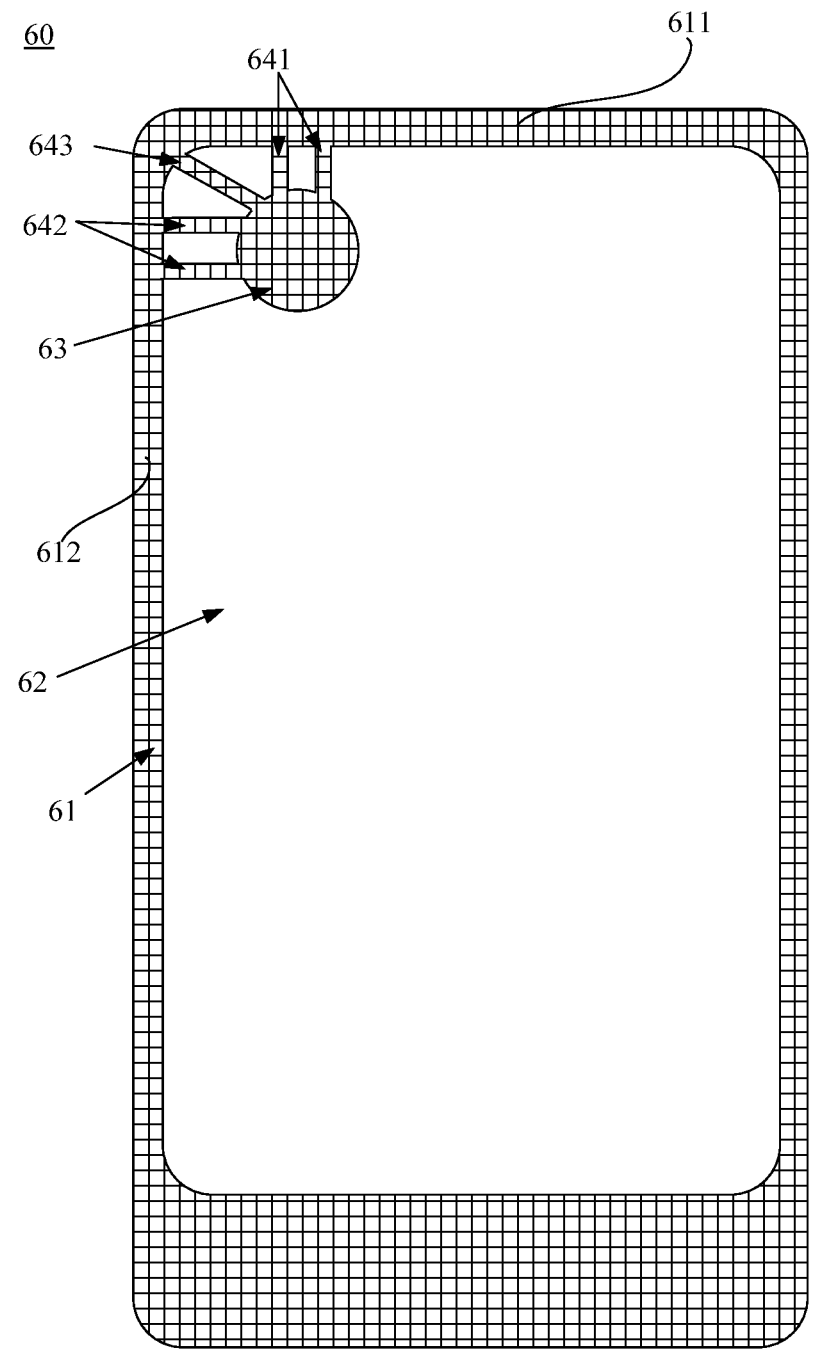
FIG. 7 is a second top view of a mask according to an embodiment of the present disclosure.

As shown in FIG. 6 to FIG. 7, the mask 60 provided in the embodiment of the present disclosure comprises:

a mask frame 61 corresponding to the non-display area A3;

a hollowed area 62 disposed in the mask frame 61 and corresponding to the display area A1;

a masking member 63 disposed in the hollowed area 62 and the mask frame 61 and corresponding to the transparent area A2; and a connecting bridge 64 (including 641, 642, and 643 in FIG. 6 or FIG. 7) connecting the mask frame 61 and the masking member 63 and corresponding to the aisle area A4.

The embodiment provides a mask, which is used to perform thermal evaporation on the common electrode layer of the light-emitting functional layer, such as a cathode layer. The mask comprises the masking member corresponding to the transparent area. By this way, when performing thermal evaporation, the common electrode layer would not be formed in the transparent area, thereby preventing water and oxygen from intruding the display area A1 along the common electrode layer after the transparent area is cut to form a through-hole.

In an embodiment of the present disclosure, as shown in FIG. 6 or FIG. 7, the mask frame 61 comprises a first mask frame 611 and a second mask frame 612 intersecting with the first mask frame 611, and the masking member 63 is connected to the first mask frame 611 and the second mask frame 612 through the connecting bridge 64.

In an embodiment of the present disclosure, the mask frame comprises a first mask frame, a second mask frame, and a third mask frame, and the masking member is connected to the first mask frame, the second mask frame, and the third mask frame through the connecting bridge.

In an embodiment of the present disclosure, the mask frame comprises a first mask frame, a second mask frame, a third mask frame, and a fourth mask frame, and the masking member is connected to the first mask frame, the second mask frame, the third mask frame, and the fourth mask frame through the connecting bridge.

In an embodiment of the present disclosure, as shown in FIG. 6 or FIG. 7, the connecting bridge 64 comprises at least one first connecting bridge 641, at least one second connecting bridge 642, and at least one third connecting bridge 643 spaced from each other, and the masking member 63 is connected to the first mask frame 611 through the at least one first connecting bridge 641, connected to the second mask frame 612 through the at least one second connecting bridge 642, and connected to a top corner of the first mask frame 611 and the second mask frame 612 through the at least one third connecting bridge 643.

In an embodiment of the present disclosure, lengths of the first connecting bridge 641, the second connecting bridge 642, and the third connecting bridge 643 range from 3 millimeters to 6 millimeters.

In an embodiment of the present disclosure, widths of the first connecting bridge 641, the second connecting bridge 642, and the third connecting bridge 643 range from 0.2 millimeters to 0.6 millimeters.

In an embodiment of the present disclosure, the widths of the first connecting bridge 641, the second connecting bridge 642, and the third connecting bridge 643 are greater than a thickness of remaining areas of the mask, which facilitates the use of shadow of the connecting bridge to manufacture an upper electrode material under the connecting bridge, thereby allowing the screen to display normally.

In an embodiment of the present disclosure, a shape of the masking member 63 may be various regular or irregular shapes, such as circular or rectangular.

In an embodiment of the present disclosure, a diameter of the masking member 63 ranges from 3 millimeters to 6 millimeters.

In an embodiment of the present disclosure, a material of the mask is stainless steel or an alloy of indium alloys. A surface of the mask has a corrosion-resistant protective film which is made of an aluminum oxide/polytetrafluoroethylene coating.

In an embodiment of the present disclosure, a thickness of the mask ranges from 0.01 millimeters to 0.3 millimeters.

In an embodiment of the present disclosure, a distance from the masking member 63 to the first mask frame 611 ranges from 100 μm to 500 μm.

In an embodiment of the present disclosure, a distance from the masking member 63 to the second mask frame 612 ranges from 100 μm to 500 μm.

In an embodiment of the present disclosure, a thickness of the masking member 63 is greater than a thickness of the mask frame 61 to facilitate evaporation.

In an embodiment of the present disclosure, as shown in FIG. 6, the shape of the masking member 63 is circular, and a number of the connecting bridge 64 is three, wherein the mask 60 comprises:

a mask frame 61 corresponding to the non-display area A3 and comprising a first mask frame 611 and a second mask frame 612 intersecting with the first mask frame 611;

a hollowed area 62 disposed in the mask frame 61 and corresponding to the display area A1;

a masking member 63 having a circular shape, disposed in the hollowed area 62 and the mask frame 61, and corresponding to the transparent area A2; and a connecting bridge 64 connecting the mask frame 61 and the masking member 63, corresponding to the aisle area A4, and comprising a first connecting bridge 641, a second connecting bridge 642, and a third connecting bridge 643.

Wherein, the masking member 63 is connected to the first mask frame 611 through the first connecting bridge 641, connected to the second mask frame 612 through the second connecting bridge 642, and connected to a top corner of the first mask frame 611 and the second mask frame 612 through the third connecting bridge 643.

The wider the width of the connecting bridge 64 is, the less likely it is to deform, but it is more difficult to evaporate an electrode material below. Therefore, the number of metal bridges can be increased, and by this way, the width of a single connecting bridge 64 can be reduced. As shown in FIG. 7, when the number of the connecting bridges 64 is five, the widths of the connecting bridges 64 can be reduced, and more electrode materials can be evaporated below.

In an embodiment of the present disclosure, as shown in FIG. 7, the shape of the masking member 63 is circular, and the number of the connecting bridges 64 is five, wherein the mask 60 comprises:

a mask frame 61 corresponding to the non-display area A3 and comprising a first mask frame 611 and a second mask frame 612 intersecting with the first mask frame 611;

a hollowed area 62 disposed in the mask frame 61 and corresponding to the display area A1;

a masking member 63 having a circular shape, disposed in the hollowed area 62 and the mask frame 61, and corresponding to the transparent area A2; and a connecting bridge 64 connecting the mask frame 61 and the masking member 63, corresponding to the aisle area A4, and comprising two first connecting bridges 641, two second connecting bridges 642, and a third connecting bridge 643.

Wherein, the masking member 63 is connected to the first mask frame 611 through the two first connecting bridges 641, connected to the second mask frame 612 through the two second connecting bridges 642, and connected to a top corner of the first mask frame 611 and the second mask frame 612 through the third connecting bridge 643.

Figure 8:
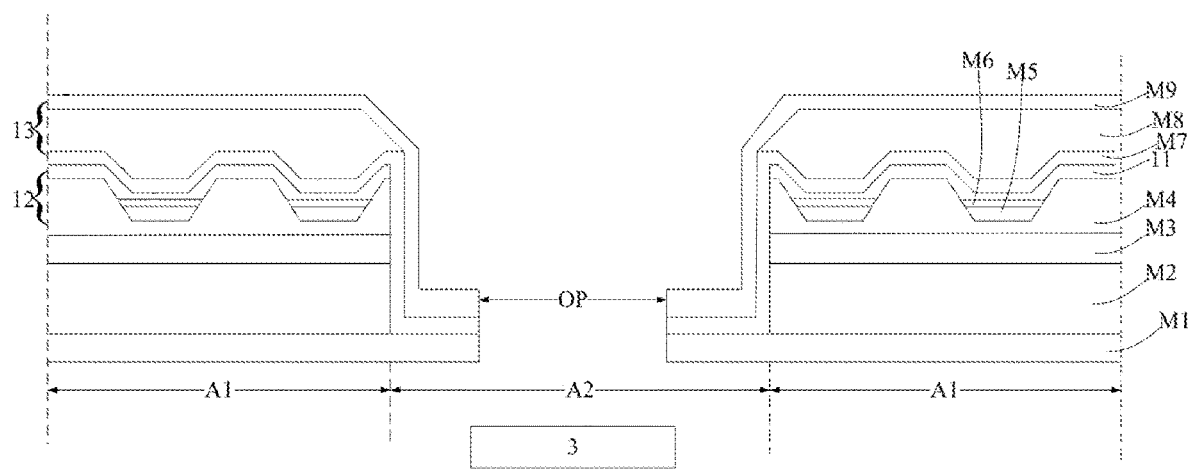
FIG. 8 is a schematic diagram of a display device according to an embodiment of the present disclosure.

In an embodiment of the present disclosure, as shown in FIG. 8, the embodiment of the present disclosure further provides a display device which comprises a display panel and an electronic component 3. The display panel comprises a non-display area A3, a display area A1, a transparent area A2 (that is a hollowed area), and an aisle area A4. Wherein, the non-display area A3 surrounds the display area A1, the transparent area A2 and the aisle area A4 are disposed in the display area A1, and the aisle area A4 connects the non-display area A3 to the transparent area A2. Wherein, the display panel 10 comprises a common electrode layer 11, and the common electrode layer 11 is not disposed in the transparent area A2 and the aisle area A4.

As shown in FIG. 8, the transparent area A2 forms a through-hole OP, and the electronic component 3 is disposed under the through-hole OP.

The embodiment of the present disclosure provides a display device. A display panel thereof comprises a non-display area, a display area, a transparent area, and an aisle area. Wherein, the non-display area surrounds the display area, the transparent area and the aisle area are disposed in the display area, and the aisle area connects the non-display area to the transparent area; wherein the display panel comprises a common electrode layer, and the common electrode layer is not disposed in the transparent area and the aisle area. Because the common electrode layer is not disposed in the transparent area and the aisle area, the common electrode layer can still be protected by other film layers and not be directly exposed after the transparent area of the display panel is cut to form a through-hole, thereby preventing water and oxygen from intruding the display area through the through-hole and along the common electrode layer, which relieves the technical problem that water and oxygen would intrude the display area along the common electrode layer in current full screen technology.

In an embodiment of the present disclosure, the display panel further comprises a buffering area surrounding the transparent area. A micro/nano structure is disposed in the buffering area, and a common electrode layer is disposed on the micro/nano structure.

In an embodiment of the present disclosure, the micro/nano structure comprises a micro/nano groove disposed on a pixel definition layer.

In an embodiment of the present disclosure, the micro/nano groove is disposed on an organic layer.

In an embodiment of the present disclosure, the micro/nano groove is a closed ring shape surrounding the transparent area.

In an embodiment of the present disclosure, the closed ring shape comprises at least one of a circle or a polygon.

In an embodiment of the present disclosure, the micro/nano structure comprises at least two micro/nano grooves.

In an embodiment of the present disclosure, a cross-sectional shape of the micro/nano grooves comprises at least one of a semi-circle, a semi-oval, a drop-shape, a rectangle, or a triangle.

It can be known according to the above embodiments:

The embodiment of the present disclosure provides a display panel and a mask. The display panel comprises a non-display area, a display area, a transparent area, and an aisle area. Wherein, the non-display area surrounds the display area, the transparent area and the aisle area are disposed in the display area, and the aisle area connects the non-display area to the transparent area; wherein the display panel comprises a common electrode layer, and the common electrode layer is not disposed in the transparent area and the aisle area. Because the common electrode layer is not disposed in the transparent area and the aisle area, the common electrode layer can still be protected by other film layers and not be directly exposed after the transparent area of the display panel is cut to form a through-hole, thereby preventing water and oxygen from intruding the display area through the through-hole and along the common electrode layer, which relieves the technical problem that water and oxygen would intrude the display area along the common electrode layer in current full screen technology.

The present disclosure has been described with a preferred embodiment thereof. The preferred embodiment is not intended to limit the present disclosure, and it is understood that many changes and modifications to the described embodiment can be carried out without departing from the scope and the spirit of the disclosure that is intended to be limited only by the appended claims.

What is claimed is:

1. A display panel, comprising a non-display area, a display area, a transparent area, and an aisle area;
    wherein the non-display area surrounds the display area, the transparent area and the aisle area are disposed in the display area, and the aisle area connects the non-display area to the transparent area;
    wherein the non-display area comprises a first frame and a second frame intersecting with the first frame, and the transparent area is connected to the first frame and the second frame through the aisle area; and
    wherein the display panel comprises a common electrode layer, and the common electrode layer is not disposed in the transparent area and the aisle area.

2. The display panel according to claim 1, wherein the aisle area comprises at least one first aisle area, at least one second aisle area, and at least one third aisle area spaced from each other, and the transparent area is connected to the first frame through the first aisle area, connected to the second frame through the second aisle area, and connected to a top corner of the first frame and the second frame through the third aisle area.

3. The display panel according to claim 1, comprising:
    a substrate;
    a drive circuit layer;
    a light-emitting functional layer comprising a pixel definition layer, a pixel electrode layer, a light-emitting material layer, and the common electrode layer; and
    an encapsulation layer;
    wherein the drive circuit layer and the light-emitting functional layer are not disposed in the transparent area.

4. The display panel according to claim 3, wherein in the transparent area, the encapsulation layer is disposed on the substrate.

5. The display panel according to claim 4, wherein the encapsulation layer comprises a first inorganic layer, an organic layer, and a second inorganic layer.

6. The display panel according to claim 5, wherein in the transparent area, the first inorganic layer is deposited on the substrate, and the second inorganic layer is deposited on the first inorganic layer.

7. The display panel according to claim 5, wherein in the transparent area, the first inorganic layer is deposited on the substrate and forms a groove, the organic layer fills the groove, and the second inorganic layer is deposited on the organic layer.

8. The display panel according to claim 3, comprising a filling layer in the transparent area, wherein the filling layer is disposed on the substrate, and the encapsulation layer is disposed on the filling layer.

9. A mask, used to manufacture the common electrode layer of the display panel according to claim 1, wherein the display panel comprises a non-display area, a display area, a transparent area, and an aisle area, wherein the non-display area surrounds the display area, the transparent area and the aisle area are disposed in the display area, and the aisle area connects the non-display area to the transparent area; wherein the mask comprises:
    a mask frame corresponding to the non-display area;
    a hollowed area disposed in the mask frame and corresponding to the display area;
    a masking member disposed in the hollowed area and the mask frame and corresponding to the transparent area; and
    a connecting bridge connecting the mask frame and the masking member and corresponding to the aisle area.

10. The mask according to claim 9, wherein the mask frame comprises a first mask frame and a second mask frame intersecting with the first mask frame, and the masking member is connected to the first mask frame and the second mask frame through the connecting bridge.

11. The mask according to claim 10, wherein the connecting bridge comprises at least one first connecting bridge, at least one second connecting bridge, and at least one third connecting bridge spaced from each other, and the masking member is connected to the first mask frame through the at least one first connecting bridge, connected to the second mask frame through the at least one second connecting bridge, and connected to a top corner of the first mask frame and the second mask frame through the at least one third connecting bridge.

12. The mask according to claim 11, wherein widths of the first connecting bridge, the second connecting bridge, and the third connecting bridge range from 0.2 millimeters to 0.6 millimeters.

13. The mask according to claim 11, wherein lengths of the first connecting bridge, the second connecting bridge, and the third connecting bridge range from 3 millimeters to 6 millimeters.

14. The mask according to claim 10, wherein a distance from the masking member to the first mask frame ranges from 100 μm to 500 μm.

15. The mask according to claim 10, wherein a distance from the masking member to the second mask frame ranges from 100 μm to 500 μm.

16. The mask according to claim 9, wherein a diameter of the masking member ranges from 3 millimeters to 6 millimeters.

17. The mask according to claim 9, wherein a material of the mask is stainless steel or an alloy of indium alloys.

18. The mask according to claim 9, wherein a thickness of the mask ranges from 0.01 millimeters to 0.3 millimeters.

19. The mask according to claim 9, wherein a thickness of the masking member is greater than a thickness of the mask frame.

\* \* \* \* \*